United States Patent
Farnworth et al.

(10) Patent No.: US 7,084,013 B2
(45) Date of Patent: *Aug. 1, 2006

(54) METHODS FOR FORMING PROTECTIVE LAYERS ON SEMICONDUCTOR DEVICE SUBSTRATES

(75) Inventors: Warren M. Farnworth, Nampa, ID (US); Alan G. Wood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/012,569

(22) Filed: Dec. 15, 2004

(65) Prior Publication Data

US 2005/0101158 A1    May 12, 2005

Related U.S. Application Data

(63) Continuation of application No. 09/589,841, filed on Jun. 8, 2000, now Pat. No. 6,875,640.

(51) Int. Cl.
H01L 21/44 (2006.01)
H01L 21/48 (2006.01)
H01L 21/50 (2006.01)

(52) U.S. Cl. .................................................. 438/127
(58) Field of Classification Search ................ None
See application file for complete search history.

(56) References Cited

U.S. PATENT DOCUMENTS

| | | | |
|---|---|---|---|
| 3,428,503 A | 2/1969 | Beckerle | |
| 4,575,330 A | 3/1986 | Hull | |
| 4,653,175 A * | 3/1987 | Brueggeman et al. | 438/15 |
| 4,752,498 A | 6/1988 | Fudim | |
| 4,794,092 A | 12/1988 | Solomon | |
| 4,945,032 A | 7/1990 | Murphy et al. | |
| 5,041,695 A | 8/1991 | Olenick et al. | |
| 5,059,021 A | 10/1991 | Spence et al. | |
| 5,088,047 A | 2/1992 | Bynum | |

(Continued)

FOREIGN PATENT DOCUMENTS

EP    0322257 A3    12/1988

(Continued)

OTHER PUBLICATIONS

U.S. Appl. No. 10/690,417, filed Oct. 20, 2003, entitled "Methods of Coating and Singulating Wafers and Chip-Scale Packages Formed Therefrom", inventor Farnworth et al.

(Continued)

Primary Examiner—David A. Zarneke
(74) Attorney, Agent, or Firm—TraskBritt

(57) ABSTRACT

Methods for forming protective layers on semiconductor devices, including semiconductor devices that are carried by fabrication substrates, that are parts of assemblies, and that include individual dies, include at least partially consolidating previously unconsolidated material selectively, in accordance with a program. The method may include use of a machine vision system or other object recognition apparatus to provide precise die-specific alignment. A protective structure may be formed to include at least one layer or segment of dielectric material having a controlled thickness or depth and a precise boundary. The layer or segment may include precisely sized, shaped, and located apertures through which conductive terminals, such as bond pads, on the surface of the die may be accessed. Dielectric material may also be employed as a structure to mechanically reinforce a die-to-substrate (e.g., die-to-lead frame) attachment.

37 Claims, 4 Drawing Sheets

U.S. PATENT DOCUMENTS

| | | | |
|---|---|---|---|
| 5,149,958 A | 9/1992 | Hallenbeck et al. | |
| 5,164,128 A | 11/1992 | Modrek et al. | |
| 5,173,220 A | 12/1992 | Reiff et al. | |
| 5,185,210 A * | 2/1993 | Zupancic | 428/457 |
| 5,227,232 A | 7/1993 | Lim | |
| 5,250,843 A | 10/1993 | Eichelberger | |
| 5,264,061 A | 11/1993 | Juskey et al. | |
| 5,278,442 A | 1/1994 | Prinz et al. | |
| 5,299,091 A | 3/1994 | Hoshi et al. | |
| 5,355,016 A | 10/1994 | Swirbel et al. | |
| 5,418,189 A | 5/1995 | Heinen | |
| 5,434,094 A | 7/1995 | Kobiki et al. | |
| 5,462,636 A | 10/1995 | Chen et al. | |
| 5,484,314 A | 1/1996 | Farnworth | |
| 5,512,710 A | 4/1996 | Schroeder | |
| 5,545,367 A | 8/1996 | Bae et al. | |
| 5,547,906 A | 8/1996 | Badehi | |
| 5,597,766 A | 1/1997 | Neppl | |
| 5,648,127 A | 7/1997 | Turchan et al. | |
| 5,705,117 A | 1/1998 | O'Connor et al. | |
| 5,897,338 A | 4/1999 | Kaldenberg | |
| 5,900,346 A | 5/1999 | Sinta et al. | |
| 5,943,235 A | 8/1999 | Earl et al. | |
| 5,945,058 A | 8/1999 | Manners et al. | |
| 5,945,130 A | 8/1999 | Saxelby, Jr. et al. | |
| 5,946,556 A | 8/1999 | Hashizume | |
| 5,987,739 A * | 11/1999 | Lake | 29/841 |
| 6,025,114 A | 2/2000 | Popat et al. | |
| 6,045,655 A | 4/2000 | DiStefano et al. | |
| 6,056,191 A | 5/2000 | Brouillette et al. | |
| 6,077,757 A | 6/2000 | Mizuno et al. | |
| 6,159,826 A | 12/2000 | Kim et al. | |
| 6,215,095 B1 | 4/2001 | Partanen et al. | |
| 6,229,204 B1 | 5/2001 | Hembree | |
| 6,242,932 B1 | 6/2001 | Hembree | |
| 6,251,488 B1 | 6/2001 | Miller et al. | |
| 6,253,116 B1 | 6/2001 | Zhang et al. | |
| 6,259,962 B1 | 7/2001 | Gothait | |
| 6,263,566 B1 | 7/2001 | Hembree et al. | |
| 6,268,584 B1 | 7/2001 | Keicher et al. | |
| 6,268,655 B1 | 7/2001 | Farnworth et al. | |
| 6,284,563 B1 | 9/2001 | Fjelstad | |
| 6,309,911 B1 | 10/2001 | Hyoudo et al. | |
| 6,326,698 B1 | 12/2001 | Akram | |
| 6,335,224 B1 | 1/2002 | Peterson et al. | |
| 6,337,122 B1 | 1/2002 | Grigg et al. | |
| 6,340,829 B1 | 1/2002 | Hirano et al. | |
| 6,372,527 B1 | 4/2002 | Khandros et al. | |
| 6,391,251 B1 | 5/2002 | Keicher et al. | |
| 6,414,374 B1 | 7/2002 | Farnworth et al. | |
| 6,420,211 B1 | 7/2002 | Brunet et al. | |
| 6,432,752 B1 | 8/2002 | Farnworth | |
| 6,482,576 B1 | 11/2002 | Farnworth et al. | |
| 6,486,546 B1 | 11/2002 | Moden et al. | |
| 6,489,007 B1 | 12/2002 | Grigg et al. | |
| 6,514,798 B1 * | 2/2003 | Farnworth | |
| 6,524,346 B1 * | 2/2003 | Farnworth | 438/763 |
| 6,875,640 B1 * | 2/2003 | Farnworth et al. | 438/127 |
| 6,528,894 B1 | 3/2003 | Akram et al. | |
| 6,544,821 B1 | 4/2003 | Akram | |
| 6,544,902 B1 | 4/2003 | Farnworth | |
| 6,549,821 B1 | 4/2003 | Farnworth et al. | |
| 6,562,278 B1 | 4/2003 | Farnworth et al. | |
| 6,585,927 B1 | 7/2003 | Grigg et al. | |
| 6,593,171 B1 | 7/2003 | Farnworth | |
| 6,621,154 B1 | 9/2003 | Satoh et al. | |
| 6,635,333 B1 | 10/2003 | Grigg et al. | |
| 6,703,105 B1 | 3/2004 | Grigg et al. | |
| 6,706,374 B1 | 3/2004 | Grigg et al. | |
| 6,709,795 B1 | 3/2004 | Farnworth et al. | |
| 6,740,476 B1 | 5/2004 | Farnworth et al. | |
| 6,762,502 B1 | 7/2004 | Akram | |
| 6,770,514 B1 | 8/2004 | Farnworth | |
| 6,791,164 B1 | 9/2004 | Farnworth | |
| 6,794,224 B1 | 9/2004 | Akram | |
| 2001/0051391 A1 | 12/2001 | Williams | |
| 2002/0171177 A1 | 11/2002 | Kritchman et al. | |
| 2002/0182782 A1 | 12/2002 | Farnworth | |
| 2003/0003180 A1 | 1/2003 | Farnworth et al. | |
| 2003/0043360 A1 | 3/2003 | Farnworth | |
| 2003/0068584 A1 | 4/2003 | Farnworth et al. | |
| 2003/0089999 A1 | 5/2003 | Akram | |
| 2003/0092220 A1 | 5/2003 | Akram | |
| 2003/0093173 A1 | 5/2003 | Farnworth et al. | |
| 2003/0102566 A1 | 6/2003 | Farnworth et al. | |
| 2003/0143819 A1 | 7/2003 | Hedler et al. | |
| 2003/0151167 A1 | 8/2003 | Kritchman et al. | |
| 2003/0203158 A1 | 10/2003 | Farnworth et al. | |
| 2003/0207213 A1 | 11/2003 | Farnworth | |
| 2004/0000744 A1 | 1/2004 | Grigg et al. | |
| 2004/0014259 A1 | 1/2004 | Farnworth | |
| 2004/0104486 A1 | 6/2004 | Boon | |
| 2004/0142058 A1 | 7/2004 | Farnworth | |
| 2004/0165362 A1 | 8/2004 | Farnworth | |

FOREIGN PATENT DOCUMENTS

| | | |
|---|---|---|
| JP | 62-238641 | 10/1987 |
| JP | 64-048423 | 2/1989 |

OTHER PUBLICATIONS

Miller et al., "Maskless Mesoscale Materials Deposition", Deposition Technology, Sep. 2001, pp. 20-22.

Miller, "New Laser-Directed Deposition Technology", Microelectronic Fabrication, Aug. 2001, p. 16.

Webpage, Object Prototyping the Future, "Object FullCure700 Series", 3 pages.

Webpage, Objet Prototyping the Future, "How it Works", 2 pages.

* cited by examiner

METHODS FOR FORMING PROTECTIVE LAYERS ON SEMICONDUCTOR DEVICE SUBSTRATES

CROSS-REFERENCE TO RELATED APPLICATION

This application is a continuation of application Ser. No. 09/589,841, filed Jun. 8, 2000, now U.S. Pat. No. 6,875,640 B1, issued Apr. 5, 2005.

BACKGROUND OF THE INVENTION

1. Field of the Invention

The present invention relates generally to stereolithography and, more specifically, to the use of stereolithography to form protective layers on substrates, such as semiconductor dice or wafers, and the resulting structures.

2. State of the Art

In the past decade, a manufacturing technique termed "stereolithography," also known as "layered manufacturing," has evolved to a degree where it is employed in many industries.

Essentially, stereolithography, as conventionally practiced, involves utilizing a computer to generate a three-dimensional (3-D) mathematical simulation or model of an object to be fabricated, such generation usually effected with 3-D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and nonmetallic materials. Regardless of the material employed to fabricate an object, stereolithographic techniques usually involve disposition of a layer of unconsolidated or unfixed material corresponding to each layer within the object boundaries. The layer of material is selectively consolidated or fixated to at least a semisolid state in those areas of a given layer corresponding to portions of the object, the consolidated or fixed material also at that time being substantially concurrently bonded to a lower layer. The unconsolidated material employed to build an object may be supplied in particulate or liquid form and the material itself may be consolidated, fixed or cured, or a separate binder material may be employed to bond material particles to one another and to those of a previously formed layer. In some instances, thin sheets of material may be superimposed to build an object, each sheet being fixed to a next lower sheet and unwanted portions of each sheet removed, a stack of such sheets defining the completed object. When particulate materials are employed, resolution of object surfaces is highly dependent upon particle size. When a liquid is employed, resolution is highly dependent upon the minimum surface area of the liquid which can be fixed (cured) and the minimum thickness of a layer which can be generated, given the viscosity of the liquid and other parameters, such as transparency to radiation or particle bombardment (see below) used to effect at least a partial cure of the liquid to a structurally stable state. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by ink-jet printing techniques), or irradiation using heat or specific wavelength ranges.

An early application of stereolithography was to enable rapid fabrication of molds and prototypes of objects from CAD files. Thus, either male or female forms on which mold material might be disposed might be rapidly generated. Prototypes of objects might be built to verify the accuracy of the CAD file defining the object and to detect any design deficiencies and possible fabrication problems before a design was committed to large-scale production.

In more recent years, stereolithography has been employed to develop and refine object designs in relatively inexpensive materials and has also been used to fabricate small quantities of objects where the cost of conventional fabrication techniques is prohibitive for the same, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques.

However, to the inventors' knowledge, stereolithography has yet to be applied to mass production of articles in volumes of thousands or millions, or employed to produce, augment or enhance products including other pre-existing components in large quantities, where minute component sizes are involved, and where extremely high resolution and a high degree of reproducibility of results is required.

In the electronics industry, computer chips are typically manufactured by configuring a large number of integrated circuits on a wafer and subdividing the wafer to form singulated devices. A coating of protective dielectric material, such as polyimide, can be formed over the wafer prior to cutting in order to prevent physical damage to each die and the circuitry thereon during handling of the die. Polyimide coatings are formed by applying a liquid polymer in a volatile carrier to the center of a spinning wafer. Thus, the polyimide layer is said to be "spun on" to the wafer. Typically, such polyimide layers have thicknesses of about 6μ. When the volatile carrier evaporates and as the polyimide layer shrinks, it warps, with the polyimide layer typically being thicker at the periphery of the wafer than at the center of the wafer, a phenomenon referred to as "dishing." Given the required tolerances for semiconductor devices, even slight dishing may drastically reduce the yield of useable dice from the wafer. Moreover, when polyimide layers are spun onto semiconductor wafers in this manner, it is difficult to provide a repeatable thickness between wafer batches.

In addition, the cure temperature required to adequately cross-link the polyimide layer is typically about 300° C. This high cure temperature may be detrimental to the integrated circuits of the dice, as well as to the bond pads exposed at the active surface of the dice.

As conventional processes, such as spin-on techniques, form polyimide layers that substantially cover an active surface of a wafer, shrinkage or warpage of the polyimide layer during evaporation or volatilization of the carrier material or during curing can stress the wafer and may damage the circuitry of semiconductor devices on the wafer.

Moreover, the resulting cure of the polyimide layer may not be a full "hard" cure. Consequently, if a die having such a polyimide layer on the active surface thereof is packaged with a polymer filled with particles of silica, such as sand with low α particle emission, the silica particles can impinge, or pass through, the polyimide layer, which is supposed to act as a physical barrier to the silica. Such impingement of silica particles can damage the circuits of the die unless expensive round silica particles are used as a filler in the packaging material.

After disposal on the active surfaces of one or more dice and curing of the polyimide layer, each of the bond pads covered by the polyimide layer is exposed to facilitate access to the bond pads. Typically, a complex, conventional mask and etch process is employed. For example, a photoresist material may then be used to form a mask and an etchant can be employed to remove portions of the polyimide layer that overlie bond pads through apertures of the mask. As is well known in the art, slight dimensional differences between wafers, including nonflatness, can occur, causing misalignment or distortion of the mask and, thus, of structures formed therethrough, such as the bond pad openings through a protective polyimide layer.

The use of mask and etch processes to pattern polyimide protective layers is also somewhat undesirable in that these processes introduce additional fabrication steps and, thus, increase fabrication time, as well as increasing the likelihood that the die or dice being fabricated will be damaged. The use of mask and etch processing also consumes expensive dielectric materials and etchants.

Finally, as is well known to those in the art, alpha particles emitted by solders, leads, sand, and other sources can create electron-hole pairs in a semiconductor device and thereby cause "soft" errors during the operation of the semiconductor device. While not permanently damaging to the semiconductor device, "soft" errors are often a nuisance to the user of a computer or other electronic device. A 6μ layer of polyimide may act to minimize such "soft" errors.

The art does not teach methods of fabricating protective layers on the active surfaces of semiconductor devices that do not stress a wafer on which the semiconductor devices are contained or that do not require a significant number of additional fabrication steps. Nor does the art teach protective layers so fabricated that reduce the incidence of soft errors in the protected semiconductor devices.

BRIEF SUMMARY OF THE INVENTION

The present invention provides a method of applying a layer of protective material to precisely defined areas on individual semiconductor devices fabricated on a semiconductor wafer, on individual dice, or on other semiconductor device component substrates. The present invention employs computer-controlled, 3-D computer-aided design (CAD) initiated, stereolithographic techniques to rapidly form precision layers of material to specific surfaces of a substrate, such as a plurality of dice on a wafer, and to an individual die.

In a preferred embodiment, the layer and associated structures are fabricated on the substrate using precisely focused electromagnetic radiation in the form of an ultraviolet (UV) wavelength laser to fix or cure a liquid material in the form of a photopolymer. However, the invention is not so limited and other stereolithographically applicable materials may be employed in the present invention.

For example, a silicon wafer comprising a large number of distinct semiconductor devices may be covered with a layer of liquid polyimide or other photopolymer which is cured only in particular locations to an at least semisolid state by precisely directed laser radiation at a substantially ambient temperature. As the regions of the layer that are cured by the laser may be selected, photopolymer located over the contact pads of the substrate can be left uncured. Thus, apertures are formed through the protective layer substantially simultaneously with formation of the protective layer. A single layer having a uniform thickness of, for example, about 25 μm (1 mil) may be formed on the surface of the wafer. Single layers having thicknesses of up to about 10 mil or more may be formed, the maximum possible thickness of each layer being limited only by the maximum depth into the liquid photopolymer that the laser beam can penetrate. Multiple superimposed layers, each separately cured, may be formed to create a protective layer of even greater thickness while maintaining a thickness accuracy not achievable by conventional techniques. Multiple superimposed layers may also be used to form one or more three-dimensional structures on the surface of the protective layer or on the surface of the substrate.

When protective layers are being formed on a wafer bearing a plurality of semiconductor devices, the protective layer may have several laterally separated regions, each corresponding to the location of one of the semiconductor devices and having apertures formed therethrough to expose bond pads of the semiconductor devices. Further, "streets" traversing the wafer between adjacent semiconductor devices may also be left uncoated, thereby reducing stress to which the wafer would otherwise be exposed if a continuous, protective layer covered the semiconductor devices and the streets therebetween. Thus, for example, each semiconductor device on a wafer may be covered with a discrete, well-defined pattern of protective material of controlled depth, shape, and size, with precisely located apertures therethrough.

The robust, relatively thick protective layer formed in accordance with teachings of the present invention may be used to physically protect, seal, and isolate circuitry of semiconductor device components from physical damage that may occur during handling, as well as electrical shorting of a semiconductor device component to other devices, damage by chemical agents, and alpha particle-induced "soft" errors. When thermoplastic materials that soften or melt at temperatures that will not damage the semiconductor device are used as the protective layer, the protective layer can also act to adhere the semiconductor device to a higher level substrate. Such protective layers are particularly useful on a die to be packaged in a "leads-over-chip" (LOC)-type arrangement where, when packaged, the leads extend over and are secured to the active surface of the semiconductor die. The protective layer may also be applied following the attachment of leads to the bond pads of a semiconductor die, for example, around the lead fingers.

The apparatus used in the present invention may also incorporate a machine vision system to locate substrates, individual semiconductor devices on a wafer, and features on substrates.

The method of the present invention encompasses the use of all known stereolithography apparatus and the application of any and all materials thereby, including both metallic and nonmetallic materials applied in any state and cured or otherwise fixed to at least a semisolid state to define a layer or layers having identifiable boundaries.

Other features and advantages of the present invention will become apparent to those of skill in the art through a consideration of the ensuing description, the accompanying drawings, and the appended claims.

BRIEF DESCRIPTION OF THE SEVERAL VIEWS OF THE DRAWINGS

The drawings of the application illustrate exemplary embodiments of the invention, wherein the illustrated features are not necessarily to scale, wherein like indicia are used for like and similar elements, and wherein.

DETAILED DESCRIPTION OF THE INVENTION

Figure 1:
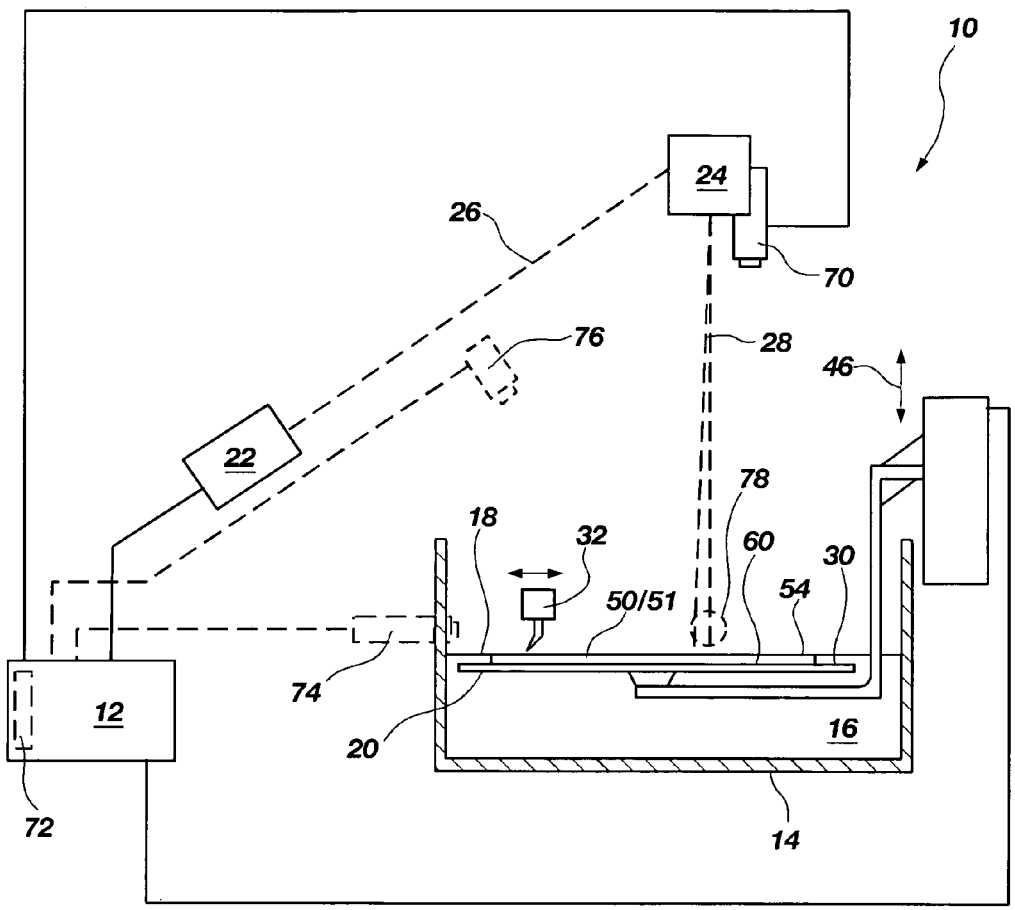
FIG. 1 is a schematic side elevation of an exemplary stereolithography apparatus suitable for use in practicing the method of the present invention.

FIG. 1 schematically depicts various components and operation of an exemplary stereolithography apparatus 10 to facilitate the reader's understanding of the technology employed in implementation of the present invention, although those of ordinary skill in the art will understand and appreciate that apparatus of other designs and manufacture may be employed in practicing the method of the present invention. The preferred stereolithography apparatus for implementation of the present invention, as well as operation of such apparatus, are described in great detail in United States Patents assigned to 3D Systems, Inc., of Valencia, Calif., such patents including, without limitation, U.S. Pat. Nos. 4,575,330; 4,929,402; 4,996,010; 4,999,143; 5,015,424; 5,058,988; 5,059,021; 5,059,359; 5,071,337; 5,076,974; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298; 5,345,391; 5,358,673; 5,447,822; 5,481,470; 5,495,328; 5,501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,850,239; 5,854,748; 5,855,718; 5,855,836; 5,885,511; 5,897,825; 5,902,537; 5,902,538; 5,904,889; 5,943,235; and 5,945,058. The disclosure of each of the foregoing patents is hereby incorporated herein by reference.

Figure 2:
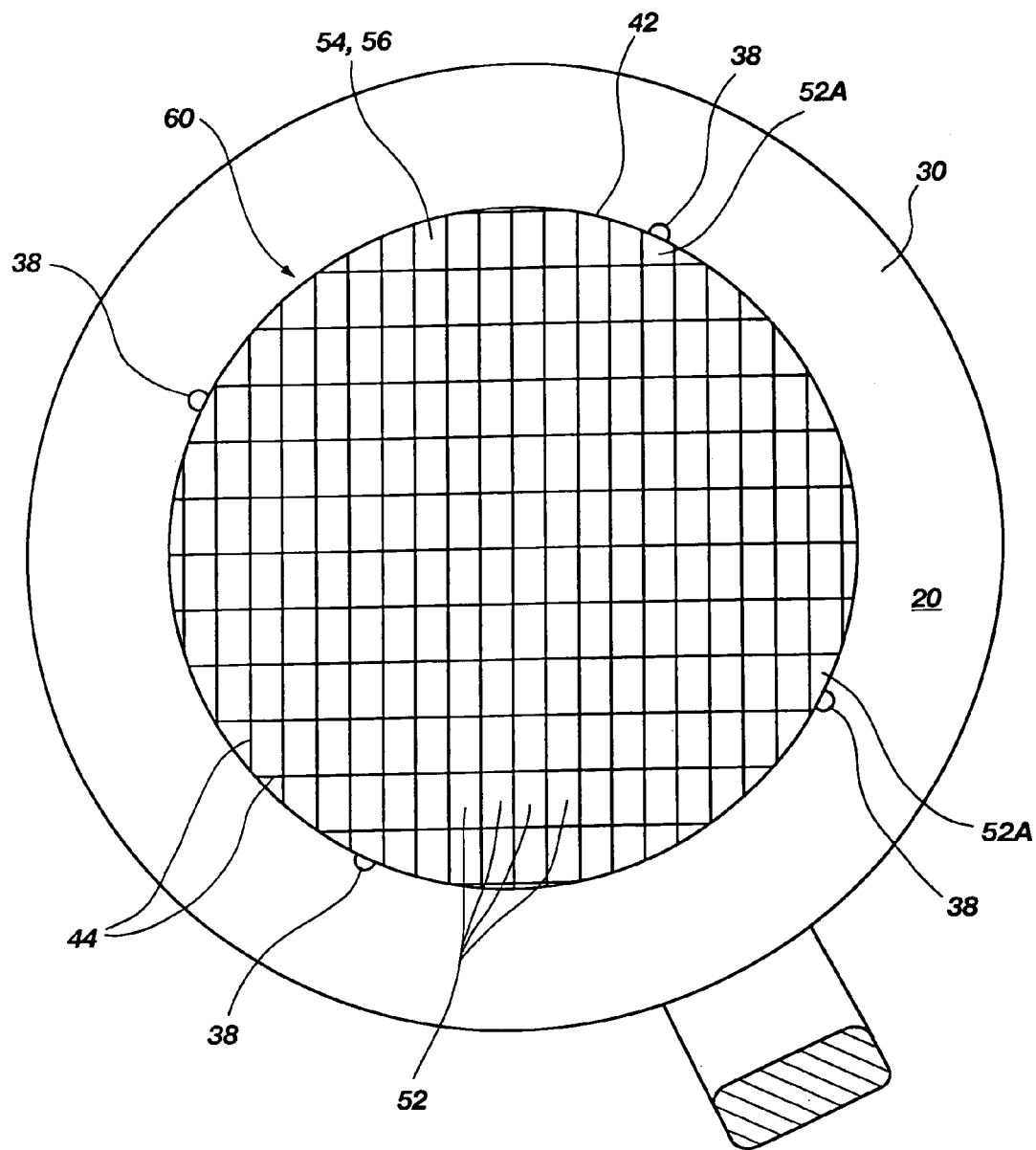
FIG. 2 is an enlarged, schematic top view of a multiple-die wafer mounted on a platform for formation of a protective layer on the dice in accordance with the method of the invention.

Improvements in the conventional stereolithographic apparatus, as described in U.S. Pat. No. 6,524,346 relate to a so-called "machine vision" system in combination with suitable programming of the computer controlling the stereolithographic process. This improvement eliminates the need for accurate positioning or mechanical alignment of workpieces to which material is stereolithographically applied. Referring to FIG. 2, alignment of the laser beam or other fixing agent may be item specific (i.e., die specific) so that a large number of distinct semiconductor devices, or dice 52, on a wafer 60, each die 52 defined by "streets" 44, may each be accurately coated with a protective layer 50 (see FIG. 10) to the same or differing specifications with regard to numbers of sub-layers 51 (see FIG. 3), layer thickness 40 (FIG. 6), and boundaries 58 (FIG. 3) of areas of dice 52 to be covered by each layer 50 of at least semisolid photopolymer material. Using a machine vision system, accuracy of the process is not dependent on the fiduciary mark 62 (FIG. 3) on a wafer 60 but on the visual recognition of specific physical characteristics of a die 52 or other substrate, whether die 52 is part of a large wafer, a partial wafer, or singulated.

With reference to FIGS. 1 through 9 and as noted above, a 3-D computer-aided design drawing of an object, such as a protective layer 50 to be fabricated in the form of a data file, is placed in the memory of a computer 12 controlling the operation of apparatus 10, if computer 12 is not a CAD computer in which the original object design is effected. In other words, an object design may be effected in a first computer in an engineering or research facility and the data files transferred via wide or local area network, tape, disc, CD-ROM or otherwise, as known in the art, to computer 12 of apparatus 10 to fabricate layer 50 or another object comprising one or more applied sub-layers 51. Each sub-layer 51 is formed or consolidated by a pass of the laser beam 28 into a layer of photo-curable material, or photopolymer. The term "active surface" is used herein to denote the actual surface as well as vertical projections thereof.

The data are preferably formatted in an STL type computer file, STL being a standardized format employed by a majority of manufacturers of stereolithography equipment. Fortunately, the format has been adopted for use in many solid-modeling CAD programs, translation from another internal geometric database format is often unnecessary. In the particular case where the apparatus 10 is to be used for applying only a single layer 50 of uniform thickness, the program may be somewhat simplified.

Apparatus 10 also includes a reservoir 14 (which may comprise a removable reservoir interchangeable with others containing different materials) of liquid material 16 to be employed in applying the intended layer 50 of protective material to the dice 52 of a wafer 60 or to singulated dice. In a currently preferred embodiment, the liquid material 16 is a photo-curable polymer (hereinafter "photopolymer") responsive to light in the UV wavelength range. The surface level 18 of the liquid material 16 is automatically maintained at an extremely precise, constant magnitude by devices known in the art responsive to output of sensors within apparatus 10 and preferably under control of computer 12. A support platform or elevator 20, precisely vertically movable in fine, repeatable increments in directions 46 responsive to control of computer 12, is located for movement downward into and upward out of liquid material 16 in reservoir 14. A UV wavelength range laser plus associated optics and galvanometers (collectively identified as 22) for controlling the scan of laser beam 26 in the X-Y plane across platform 20 has associated therewith mirror 24 to reflect laser beam 26 downwardly as beam 28 toward surface 30 of platform 20 or, more particularly, toward surface 54 of a wafer 60 positioned on surface 30. Beam 28 is traversed in a selected pattern in the X-Y plane, that is to say, in a plane parallel to surface 30, by initiation of the galvanometers under control of computer 12 to at least partially cure, by impingement thereon, selected portions of liquid material 16 disposed over surface 54 to at least a semisolid state. The use of mirror 24 lengthens the path of the laser beam 26, effectively doubling same, and provides a more vertical beam 28 than would be possible if the laser 22 itself were mounted directly above surface 30, thus enhancing resolution. In the exemplary method described herein, a wafer 60 may be precisely coated with a protective layer 50 irrespective of wafer size or number of dice 52. Thus, current stereolithographic equipment will accommodate wafers 60 up to 12 or more inches in X and Y dimensions, and it is expected that equipment size will increase as the ability to produce even larger wafers becomes commonplace. Base supports, not shown, may be placed on platform 20 prior to introduction of the wafer 60, to support the wafer 60 in a highly planar, level position. Apparatus 10 may be programmed to stereolithographically form such supports on platform 20.

While the invention is described in terms of a liquid material polymerizable to a semisolid and/or solid, the process may be varied to use a powdered material, for example. The term "unconsolidated" will be used herein to denote the unpolymerized material, which becomes "altered" or "consolidated" by the laser radiation to at least a semisolid state.

Wafer 60 or another substrate may be secured to the platform 20 so that it will not move thereon during formation of the layer 50. As seen in FIG. 2, wafer 60 may be attached to the platform 20 by at least two small edge supports 38 which may be formed in situ by apparatus 10 prior to forming layers 50 on the dice 52 of the wafer 60. Edge supports 38 are formed from liquid photopolymer material 16 which is at least partially cured by a laser beam 28 prior to forming layers 50 on the dice 52. The locations of edge supports 38 are preferably at the edges 42 of unusable partial dice 52A (on a round wafer 60), and align the wafer edge 42 and surface 30 of the platform 20. Edge supports 38 may be formed prior to placing a wafer 60 on platform 20 and configured to hold wafer 60 in place upon platform 20. Edge supports 38 may also be configured to align wafer 60 on platform 20. Alternatively, edge supports 38 may be formed after a wafer 60 has been positioned on platform 20. Edge supports 38 may be formed of a partially cured material whose attachment to the platform 20 is readily releasable or a solvent may be used to dissolve the edge supports 38. Such solvent materials are known in the art. See, for example, U.S. Pat. No. 5,447,822 referenced above and previously incorporated herein by reference. The data for forming such edge supports 38 may be programmed as a separate STL file.

A camera 70 is then activated to locate the position and orientation of each die 52 or other substrate on which a layer 50 is to be placed by scanning platform 20 and comparing the features of dice 52 with those in the data file residing in memory, the locational and orientational data for each die then also being stored in memory. It should be noted that the data file representing the design, size, shape, and topography for dice 52 or other substrates may be used at this juncture to detect physically defective or damaged dice 52. It should also be noted that data files for more than one type (size, thickness, configuration, surface topography) of a die 52 or other substrate may be placed in computer memory and computer 12 programmed to recognize locations and orientations of dice 52 or other substrates, as well as the boundaries 58 which define the layer 50 which is to be formed, and a laser path for forming the layer.

Referring now to both FIGS. 1 and 2, data from the STL files resident in computer 12 is manipulated to form layer 50 one sub-layer 51 at a time on each die 52 or other substrate. Accordingly, where layer 50 is formed of a plurality of individually formed sub-layers 51, the data mathematically representing layer 50 are divided into subsets, each subset representing a slice or sub-layer 51 of layer 50. This is effected by mathematically sectioning the 3-D CAD model into a plurality of horizontal sub-layers 51, a "stack" of such sub-layers 51 representing layer 50. Each slice or sub-layer 51 may be from about 0.0001 to about 0.0300 inch thick. As mentioned previously, a thinner slice promotes higher resolution by enabling better reproduction of fine vertical surface features of sub-layer 51. Where a "recoater" blade 32 is employed as described below, the interposition of base supports precludes inadvertent contact of recoater blade 32 with the surface 54 of wafer 60 or the surface of another substrate.

Before fabrication of layer 50 is initiated with apparatus 10, the primary STL file is configured for the particular dice 52 or other substrates upon which layers 50 are to be formed. Thus, by way of example and not by way of limitation, the primary STL file is integrated with the file used for forming the integrated circuits on the dice 52 or the features on other substrates. It should be recognized that, while reference is made herein to sequentially forming a layer 50 on dice 52 of a wafer 60, the same process may be used to form a layer 50 on a singulated die 52 or other individual substrate. Furthermore, a wafer 60 having dice 52 of differing dimensions and/or layout may be accommodated by merging of the STL files of the different dice 52 into the primary STL file. Operational parameters for apparatus 10 are then set, for example, to adjust the size (e.g., diameter, if circular) of the laser beam 28 used to alter the state of (i.e., cure) material 16.

Before initiation of a first sub-layer 51 of layer 50 is commenced, computer 12 automatically checks and, if necessary, adjusts by means known in the art, the surface level 18 of liquid material 16 in reservoir 14 to maintain the same at an appropriate focal length for laser beam 28. U.S. Pat. No. 5,174,931, referenced above and previously incorporated herein by reference, discloses one suitable level control system. Alternatively, the height of mirror 24 may be adjusted responsive to a detected surface level 18 to cause the focal point of laser beam 28 to be located precisely at the surface of liquid material 16 at surface level 18 if level 18 is permitted to vary, although this approach is somewhat more complex. The platform 20 may then be submerged in liquid material 16 in reservoir 14 to a depth equal to the thickness of one sub-layer 51 or slice of the layer 50 or another object to be fabricated and the liquid surface level 18 readjusted as required to accommodate liquid material 16 displaced by submergence of platform 20. Laser 22 is then activated so that laser beam 28 will scan liquid material 16 in a defined path over surface 54 of each substrate, such as the illustrated die 52, in turn to at least partially cure (e.g., at least partially polymerize) liquid material 16 at selective locations on each die 52. For example, laser 22 first defines the boundaries 58 of a first sub-layer 51 on die 52 and fills in solid portions thereof to complete the layer. The boundaries 58 may circumscribe bond pads 34 (FIGS. 3 through 9) or other features on die surface 56 of die 52 which are intended to be left exposed for connection to higher-level packaging as by wire bonding, tape-automated bonding ("TAB") using flex circuits, use of projecting conductive connectors in a "flip-chip" configuration, or otherwise, as known in the art. The circumscription of such features is specified in the STL files in computer 12. In the event that complete layer 50 comprises more than one single sub-layer 51, platform 20 is then lowered by a distance equal to the thickness of a sub-layer 51, and the laser beam 28 scanned to define and fill in a second sub-layer 51 while simultaneously bonding the second sub-layer 51 to the first sub-layer 51. The process is then repeated, sub-layer by sub-layer, until layer 50 is completed.

If a recoater blade 32 is employed, the process sequence is somewhat different. In this instance, the surface 30 of platform 20 is lowered into liquid material 16 below surface level 18, then raised thereabove until it is precisely a thickness of sub-layer 51 below recoater blade 32. Recoater blade 32 then sweeps horizontally over surface 56 of die 52, or (to save time) at least over a portion thereof on which layer 50 is to be fabricated, to remove excess liquid material 16 and leave a film thereof of the precise, desired thickness on surface 56. Platform 20 is then lowered so that the surface of the film and surface level 18 are coplanar and the surface of the liquid material 16 is still. Laser 22 is then initiated to scan with laser beam 28 and define the first sub-layer 51. The process is repeated, sub-layer by sub-layer, to define each succeeding sub-layer 51 and simultaneously bond the same to the next lower sub-layer 51 until layer 50 is completed. The process is then repeated for each die 52 of wafer 60 or on each of another type of semiconductor device component substrate on which a layer 50 is to be formed. A more detailed discussion of this sequence and apparatus for performing the same is disclosed in U.S. Pat. No. 5,174,931, previously incorporated herein by reference.

As an alternative to the above approach to preparing a layer of liquid material 16 for scanning with laser beam 28, a layer of liquid material 16 may be formed on surface 56 of a substrate, such as the illustrated die 52, by lowering platform 20 to flood liquid material 16 over surface 56 or over the highest completed sub-layer 51 of layer 50, then raising platform 20 and horizontally traversing a so-called "meniscus" blade across the platform (or just the formed portion of layer 50) of a thickness equal to one sub-layer 51 thereabove, followed by initiation of laser 22 and scanning of laser beam 28 to define the next higher sub-layer 51.

Yet another alternative to layer preparation of liquid material 16 is to merely lower platform 20 to a depth equal to that of a layer of liquid material 16 to be scanned and then traverse a combination flood bar and meniscus bar assembly horizontally over platform 20 to substantially concurrently flood liquid material 16 over surface 54 of wafer 60 and define a precise layer thickness of liquid material 16 for scanning.

All of the foregoing approaches to flooding, layer definition and apparatus of initiation thereof are known in the art, therefore, no further details relating thereto will be provided.

Each sub-layer 51 of complete layer 50 is preferably built by first defining any internal and external object boundaries 58 of that sub-layer 51 with laser beam 28, then hatching solid areas of complete layer 50 with laser beam 28. If a particular part of a particular sub-layer 51 is to form a boundary 58 of a void in the object above or below that sub-layer 51, then the laser beam 28 is scanned in a series of closely spaced, parallel vectors so as to develop a continuous surface, or skin, with improved strength and resolution. The time it takes to form each sub-layer 51 depends upon its geometry, surface tension and viscosity of liquid material 16, and thickness of the layer.

Once the protective layer 50 or other objects are completed on the substrate, such as the illustrated dice 52 of wafer 60, platform 20 is elevated above surface level 18 of liquid material 16, and wafer 60 with protective layers 50 on dice 52 thereof may be removed from apparatus 10. Excess, uncured liquid material 16 on the surface of wafer 60 may be removed, for example, by a manual removal step and solvent-cleaning. Layer 50 on each die 52 of wafer 60 may then require postcuring, as material 16 may be only partially polymerized and exhibit only a portion (typically 40% to 60%) of its fully cured strength. Postcuring to completely harden layers 50 over the entire wafer 60 or portions thereof, on singulated dice 52, or on other semiconductor device component substrates may be effected in another apparatus projecting UV radiation in a continuous manner over wafer 60 or dice 52 and/or by thermal completion of the initial, UV-initiated partial cure. Singulation of the individual dice 52 of a wafer 60 is preferably done following the completed cure but may also be effected prior to a completed cure.

Figure 3:
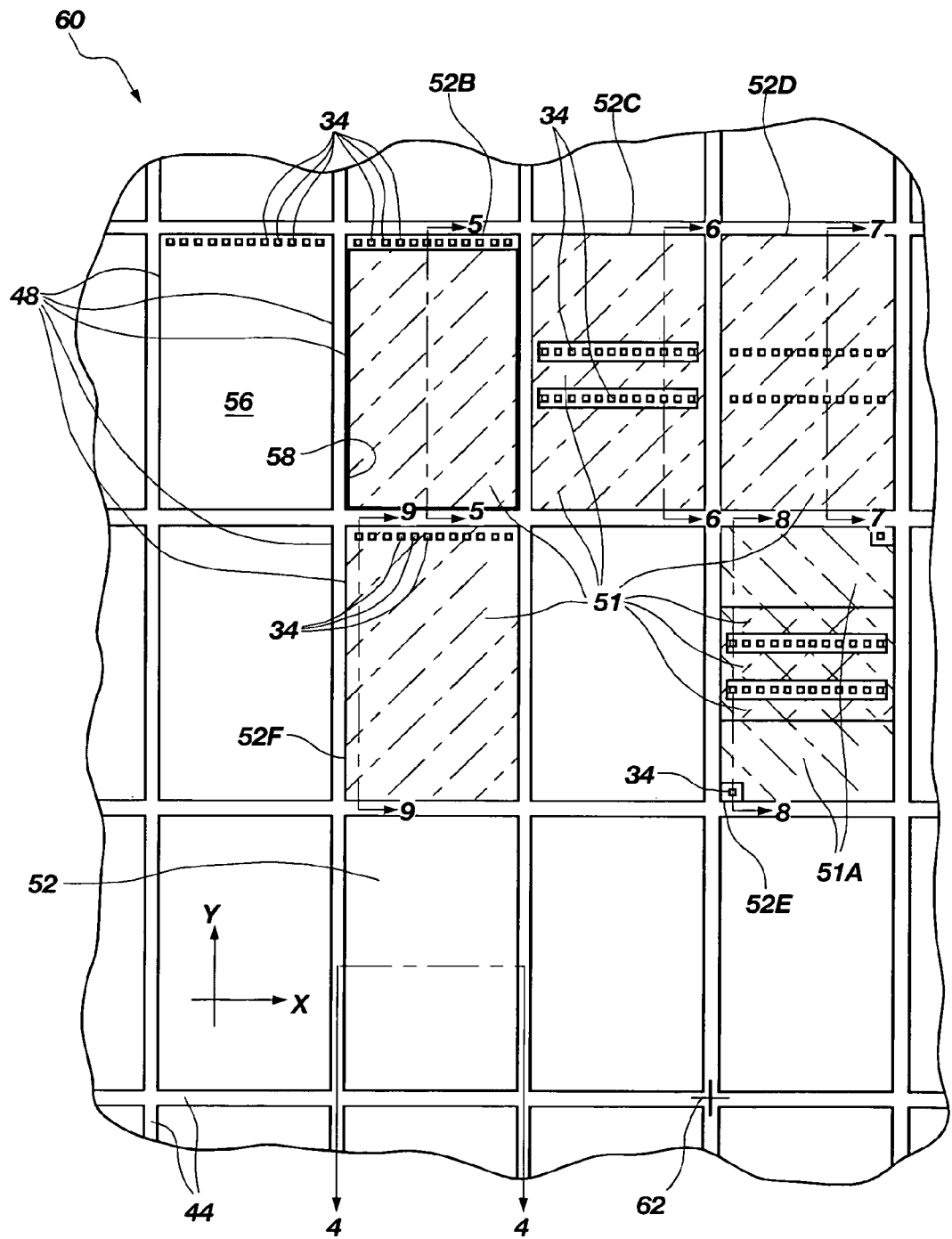
FIG. 3 is a further enlarged top view of a portion of the wafer of FIG. 2 illustrating several configurations of a protective layer formed by the method of the invention.
Figure 4:
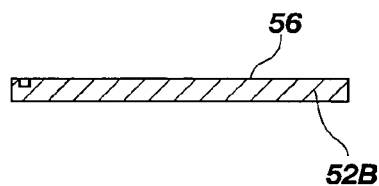
FIG. 4 is a side cross-sectional view taken along line 4—4 of FIG. 3 and depicting a die of an exemplary wafer prior to formation of a protective layer thereon.

A small portion of wafer 60 is shown in FIG. 3, having a plurality of unusable partial dice 52B, 52C, 52D, 52E and 52F, etc., with die edges 48 separated by streets 44 in the X and Y directions. FIGS. 3 and 4 illustrate a die 52, 52B prior to the formation of a protective layer 50 (FIGS. 1 and 8) thereon. For the sake of simplicity, other details of the surface 56 of die 52 are not shown.

Figure 5:
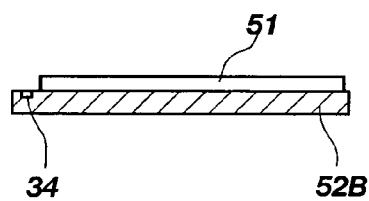
FIG. 5 is a side cross-sectional view taken along line 5—5 of FIG. 3 and depicting a die of an exemplary wafer having a protective layer thereon.
Figure 7:
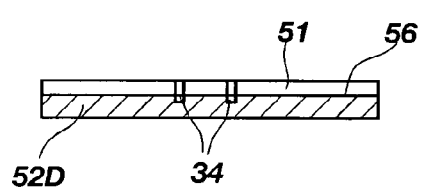
FIG. 7 is a side cross-sectional view taken along line 7—7 of FIG. 3 and depicting a die of an exemplary wafer having a protective layer thereon.

FIGS. 3 and 5 illustrate the same type of die 52B with a sub-layer 51 of protective material formed thereon within boundary 58. Boundary 58 excludes the entire end of die 52B having bond pads 34 thereon.

Figure 6:
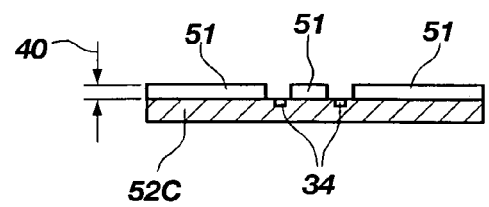
FIG. 6 is a side cross-sectional view taken along line 6—6 of FIG. 3 and depicting a die of an exemplary wafer having a protective layer thereon.

In FIGS. 3 and 6, die 52C has two rows of centrally located bond pads 34. Coverage by sub-layer 51 is complete except for the bond pads 34 and adjacent areas.

Figure 8:
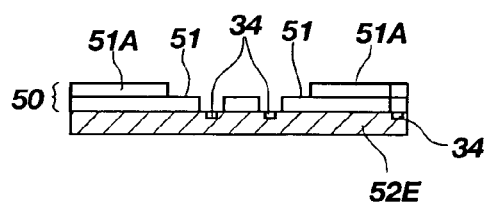
FIG. 8 is a side cross-sectional view taken along line 8—8 of FIG. 3 and depicting a die of an exemplary wafer having a protective layer thereon.

As shown in FIGS. 3 and 8, die 52E has a first sub-layer 51 on the surface thereof A second sub-layer 51A is then formed over particular areas of sub-layer 51 to increase the thickness of layer 50 in those areas. Again, the bond pads 34 and adjacent areas are exempted from coverage by both sub-layers 51, 51A. It is noted that in this method, the walls of apertures formed through layer 50 above a bond pad 34 may be substantially vertical, angled or otherwise shaped. When layer 50 has a plurality of sub-layers, the orientation or configuration of the aperture walls can be programmed into the STL file.

Figure 9:
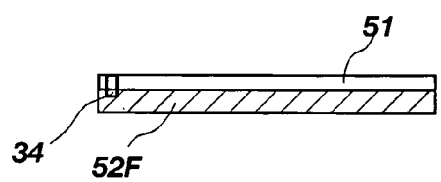
FIG. 9 is a side cross-sectional view taken along line 9—9 of FIG. 3 and depicting a die of an exemplary wafer having a protective layer thereon.

The ability to precisely direct the laser beam 28 to uniformly cover a small target area enables the method to provide very accurate and precise inner or outer boundaries 58. As illustrated in FIGS. 3 and 9, die 52F is shown with a sub-layer 51 precisely surrounding each bond pad 34. Similarly, in FIGS. 3 and 7, die 52D is illustrated as representing a die surface 56 covered by protective sub-layer 51. Sub-layer 51 is formed so as to leave bond pads 34, which are located in centrally extending rows, exposed therethrough.

The various types of layer coverage depicted in FIGS. 3 through 9 are exemplary only and not intended to be limiting. Any portion of any die 52 of any configuration may have a layer 50 formed thereon by this invention, using one material layer or two or more superimposed, contiguous, mutually adhered sub-layers 51.

When layer 50 or regions thereof are fabricated from a thermoplastic material having a softening or melting temperature that will not damage die 52, the thermoplastic regions of layer 50 may also be used as an adhesive, or glue, to secure die 52 to a substrate in face-down orientation. The thermoplastic material of layer 50 is disposed in a configuration and thickness that, when heated to at least the softening temperature thereof, will adhere die 52 to a substrate or other component of a semiconductor device assembly in a desired manner. When the material of layer 50 softens at a temperature that also wets or melts conductive structures secured to bond pads 34 while continuing to laterally support the conductive structures, die 52 may be secured to a substrate or other component of a semiconductor device assembly substantially simultaneously with the electrical connection of a conductive structure to a contact of the other component.

In practicing the present invention, a commercially available stereolithography apparatus operating generally in the manner as that described with respect to apparatus 10 of FIG. 1 is preferably employed. For example and not by way of limitation, the SLA-250/50HR, SLA-5000 and SLA-7000 stereolithography systems, each offered by 3D Systems, Inc., of Valencia, Calif. are suitable for practice of the present invention. Photopolymers believed to be suitable for use in practicing the present invention include Cibatool SL 5170 and SL 5210 resins for the SLA-250/50HR system, Cibatool SL 5530 resin for the SLA-500 and Cibatool SL 7510 resin for the SLA-7000 system. All of these resins are available from Ciba Specialty Chemicals Inc. Materials are selected for dielectric constant, purity (semiconductor grade), good adherence to other semiconductor device materials, and a coefficient of thermal expansion (CTE) sufficiently similar to that of the dice 52 to which the material is applied so that the dice 52 and cured material thereon are not unduly stressed during thermal cycling in testing and subsequent normal operation. One area of particular concern in determining resin suitability is the substantial absence of mobile ions and, specifically, fluorides. By way of example and not limitation, the layer thickness 40 of material 16 to be formed, for purposes of the invention, may be on the order of about 0.001 inch (1 mil) to about 0.020 inch (20 mils), with a high degree of uniformity over a field on a surface 56 of a die 52 or other substrate. In order to achieve a desired physical, environmental, and alpha particle protection of a semiconductor die 52, it is presently believed that a preferred total layer thickness 40 is about 0.004 to about 0.015 inch (4 to 15 mils). As noted previously herein, such thicknesses may be achieved with a single layer. It should be noted that different sub-layers 51 may be of different thicknesses so as to form a completed layer 50 of a precise, intended total height or to provide different material thicknesses for different portions of layer 50. The size of the laser beam "spot" impinging on the surface of liquid material 16 to cure the same may be on the order of 0.002 inch to 0.008 inch. Resolution is preferably ±0.0003 inch in the X-Y plane (parallel to surface 30 of platform 20) over at least a 0.5 inch×0.25 inch field from a center point, permitting a high resolution scan effectively across a 1.0 inch×0.5 inch area. Of course, it is desirable to have substantially this high a resolution across the entirety of surface 54 of a whole wafer 60 to be scanned by laser beam 28, such area being termed the "field of exposure." The longer and more effectively vertical the path of laser beam 26/28, the greater the achievable resolution.

Referring again to FIG. 1 of the drawings, improved performance of this process is achieved by certain additions to apparatus 10. As depicted, apparatus 10 includes a camera 70 which is in communication with computer 12 and preferably located, as shown, in close proximity to mirror 24 located above surface 54 of wafer 60 or another substrate on which a layer 50 according to the invention is to be formed. Camera 70 may be any one of a number of commercially available cameras, such as capacitative-coupled discharge (CCD) cameras available from a number of vendors. Suitable circuitry as required for adapting the output of camera 70 for use by computer 12 may be incorporated in a board 72 installed in computer 12, which is programmed as known in the art to respond to images generated by camera 70 and processed by board 72. Camera 70 and board 72 may together comprise a so-called "machine vision system," and specifically a "pattern recognition system" (PRS), operation of which will be described briefly below for a better understanding of the present invention. Alternatively, a self-contained machine vision system available from a commercial vendor of such equipment may be employed. For example, and without limitation, such systems are available from Cognex Corporation of Natick, Mass. The apparatus of the exemplary Cognex BGA Inspection Package™ or SMD Placement Guidance Package™ may be adapted to the present invention, although it is believed that the MVS-8000™ product family and the Checkpoint® product line, the latter employed in combination with Cognex PatMax™ software, may be especially suitable for use in the present invention.

It is noted that a variety of machine vision systems are in existence, examples of which and their various structures and uses are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated by this reference.

In order to facilitate practice of the present invention with apparatus 10, a data file representative of the surface of a substrate, such as a die 52 or wafer 60, on which a layer 50 is to be formed, is placed in the memory of computer 12. The data file will contain information, such as die surface dimensions and visual features of the substrate. When the substrate is a wafer, the data file can also include information about the spacing and layout of dice 52 on wafer 60. The data file will also contain information defining the specific area(s) of the surface of the substrate which are to be covered with layer 50 and the desired depth of coverage and, in addition, a defined path of laser beam 28 as controlled by mirror 24 to achieve the desired coverage.

Continuing with reference to FIG. 1 of the drawings, a substrate, such as the illustrated wafer 60, on platform 20 may be submerged partially below the surface level 18 of liquid material 16 to a depth the same as, or greater than, the desired thickness 40 of a first sub-layer 51 of liquid material 16 to be at least partially cured to a semisolid state. If platform 20 was lowered to a greater depth than a sub-layer 51 thickness 40, platform 20 is then raised to such a depth that the thickness of liquid material 16 over an upper surface of wafer 60 is equal to the layer thickness 40, the surface level 18 of the liquid material 16 being allowed to stabilize. The liquid material 16 selected for use in applying a protective layer 50 to dice 52 may be one of the above-referenced resins from Ciba Specialty Chemicals Inc. which exhibits a desirable dielectric constant, is of sufficient (semiconductor grade) purity, of a desirable hardness for physical protection, and which is similar in coefficient of thermal expansion (CTE) to that of the substrate, such as die 52, on which layer 50 is to be formed so that neither the substrate nor layer 50 are unduly stressed during thermal cycling in subsequent packaging, testing and normal operation.

Laser 22 is then activated and scanned to direct beam 28, under control of computer 12, across the desired portion of the surface of the substrate (e.g., surface 56) to effect the partial cure of material 16 to form a first sub-layer 51 on the substrate. If the substrate is a die 52 or a wafer 60, the laser 22 is then refocused to another die 52 and the process repeated. If any portion of die surface 56 is to have a second (or more) sub-layer(s) 51, the platform 20 is lowered further into reservoir 14, and can also be raised as before, to submerge the substrate and formed sub-layers 51 into liquid material 16. The laser 22 is then activated to form another sub-layer 51A atop sub-layer 51, for example. It should be noted that thickness 40 of material 16 over a selected portion of a given substrate (e.g., die 52) may be altered die by die, again responsive to output of camera 70 or one or more additional cameras 74, 76, and 78, shown in broken lines, which detect particular features of the substrate.

It should be noted that the laser treatment may be carried out to form a boundary 58 which adheres to the surface (e.g., die surface 56) of the substrate and the sub-layer 51 within the boundary 58 is lightly cured to form a semisolid "skin" which encloses liquid material 16. Trapped, unconsolidated material will eventually cure due to the cross-linking initiated in the outwardly adjacent photopolymer. The cure of sub-layer 51 may be subsequently accelerated by broad-source UV radiation in a chamber, or by thermal cure in an oven. In this manner, an extremely thick protective layer 50 may be formed in minimal time within apparatus 10.

Figure 10:
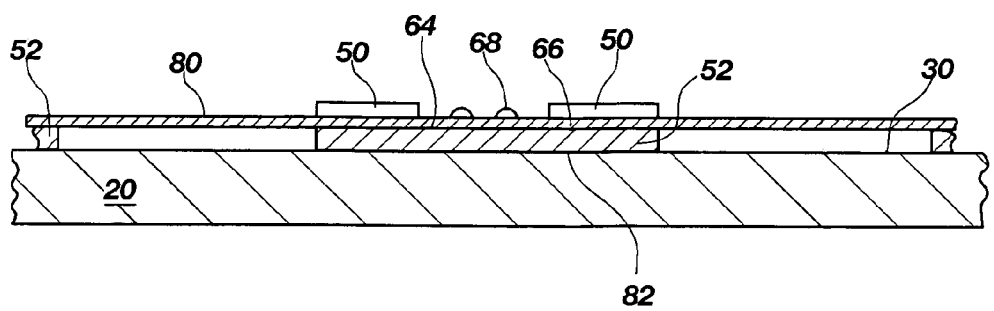
FIG. 10 is a side cross-sectional view of a lead frame-mounted die having a protective layer formed thereon in accordance with the invention.

As illustrated in FIG. 10, the method of the invention may be adapted to form layers 50 on dice 52 (e.g., LOC dice) already mounted on lead frames 66. In the example of FIG. 10, a series of dice 52 have active surfaces 64 secured to lead frames 66 of lead frame strip 80 and electrically connected thereto, such as by wire bonds 68, thermocompression bonding, TAB bonding, or otherwise as known in the art. A layer 50 of semisolid material formed from liquid material 16 may be formed on any particular portion of the active surface 64 or back side 82 (including lead frame 66) of each die 52, for protection, insulation or other purpose. In the example of FIG. 10, a layer 50 of semisolid material is to be formed on portions of the active surface 64 of a die 52 suspended from lead frame strip 80 and supported on platform 20. Layer 50 surrounds lead fingers of the lead frame 66 and provides attachment thereof to die 52. As already described, a film of liquid material 16 is formed atop the active surface 64 and lead frame 66. A narrow beam 28 of UV laser radiation is precisely scanned by stereolithographic means over particular areas to partially cure the material 16 to form a semisolid layer 50. The lead frame strip 80 is then repositioned to place the next sequential die 52 in place for formation of layer 50. It should be noted that the process may be conducted without an underlying platform 20 provided that the die 52 and lead frame strip 80 are securely joined and a vertical position of the combination may be precisely attained and retained without underlying support.

Figure 11:
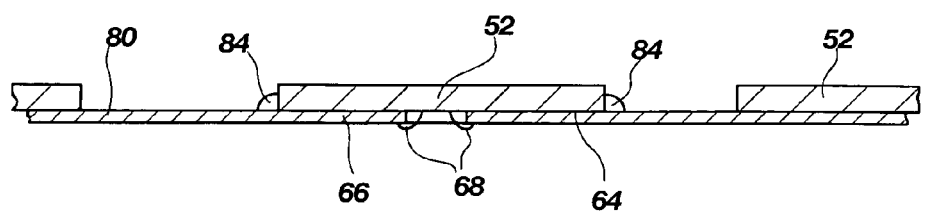
FIG. 11 is a side cross-sectional view of a lead frame-mounted die configured for forming a protective layer thereon in accordance with another embodiment of the invention.

In another variation, shown in the example of FIG. 11, a narrow sub-layer 51 defining an attachment 84 of semisolid material may be first formed with the dice 52 positioned atop the lead frame strip 80, this layer formed adjacent the periphery of the dice 52 to join outer portions of the lead fingers to the dice. Attachment 84 may be formed by submerging the lead frame strip 80 and die 52 to a level providing the desired reinforcement member and partially curing by laser radiation. Following this step, the lead frame strip 80 may then be inverted and a layer 50 (not shown) applied to the active surface 64 of lead frame 66 side, of the die 52, electrically connected thereto, such as by wire bonds 68, as indicated above.

It is notable that the method depicted and described with respect to FIGS. 10 and 11 have utility with a variety of lead frame configurations, including conventional lead frames having a die mounting paddle, or paddle-less leads-over-chip (LOC) lead frames or leads-under-chip (LUC) lead frames. The method is adaptable to dice 52 configured for packaging as zig-zag in-line (ZIP) packages, single in-line (SIP) packages, dual in-line packages (DIP), thin small outline packages (TSOP), quad flat packs (QFP), direct die connect packages (DDC), or otherwise.

It is also notable that the present invention provides a rapid method for forming layers of protective material precisely on specified areas of singulated dice 52, many dice of a wafer 60, or dice joined to a lead frame strip 80. The method conserves material 16, since all such material in which cure is not initiated by laser beam 28 remains in a liquid state in reservoir 14 for continued use.

As the packaging method of the present invention is conducted at substantially ambient temperature, the small beam spot size and rapid traverse of laser beam 28 on the semiconductor dice 52 or other substrate results in negligible thermal stress thereon.

Referring to FIGS. 1 through 10 of the drawings, it will be apparent to the reader that the present invention involves a substantial departure from prior applications of stereolithography, in that the structures of preformed electrical components are modified by forming layered structures thereon using computer-controlled stereolithography.

It should be re-emphasized that the stereolithographic technique of the present invention is suitable for covering, or leaving uncovered, any desired portion of a semiconductor device component substrate, such as semiconductor die 52, so that electrical connections for connection to lead frames, test equipment or higher-level packaging may be left bare.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method for fabricating a protective structure on a semiconductor device, comprising selectively altering a state of a protective material over at least a portion of a surface of a semiconductor device structure from an unconsolidated state to an at least partially consolidated state, without at least partially consolidated protective material located over another portion of the surface.

2. The method of claim 1, wherein selectively altering is effected in accordance with a program.

3. The method of claim 1, wherein selectively altering comprises directing a controlled, discrete beam of radiation onto the protective material located over at least the portion.

4. The method of claim 3, wherein directing comprises directing a controlled, discrete beam of focused ultraviolet laser radiation.

5. The method of claim 1, further comprising forming at least one layer of unconsolidated protective material over the surface before selectively altering the state of the protective material.

6. The method of claim 1, wherein selectively consolidating is effected over a surface of a substrate carrying a plurality of semiconductor devices.

7. The method of claim 1, further comprising removing unconsolidated protective material from the surface of the at least one semiconductor device structure following the selectively consolidating.

8. The method of claim 1, further comprising further consolidating the at least partially consolidated protective material.

9. The method of claim 1, wherein selectively altering is effected without forming at least partially consolidated protective material over at least one bond pad on the surface of the semiconductor device structure.

10. A method for forming a layer of protective material on at least one specified area on an active surface of one or more selected dice of a plurality of semiconductor dice of a semiconductor substrate, comprising:
selectively altering the state of a protective material over the active surface to at least partially consolidate the protective material over the at least one specified area without forming at least partially consolidated protective material over other regions of the active surface, including regions between at least two adjacent semiconductor dice.

11. The method of claim 10, wherein selectively altering is effected in accordance with a program.

12. The method of claim 10, wherein selectively altering comprises directing a controlled, discrete beam of radiation onto the protective material located over the at least one specified area.

13. The method of claim 10, further comprising:
forming at least one layer of unconsolidated protective material over a surface of the semiconductor substrate before selectively altering the state of the protective material.

14. The method of claim 10, further comprising:
removing unconsolidated protective material from the surface of the at least one semiconductor die following the selectively consolidating.

15. The method of claim 10, further comprising:
further consolidating the at least partially consolidated protective material.

16. The method of claim 10, wherein selectively altering comprises leaving the protective material over at least one bond pad on the active surface of the one or more selected dice in the unconsolidated state.

17. The method of claim 10, further comprising:
removing protective material in an unconsolidated state from the active surface.

18. The method of claim 10, further comprising:
further consolidating protective material in an at least partially consolidated state.

19. The method of claim 10, further comprising:
singulating at least the one or more selected dice from the wafer.

20. A method for forming a protective layer on a selected portion of a surface of a semiconductor device, comprising:
providing a semiconductor die with an active surface thereof secured to a lead frame of a lead frame strip; and
selectively altering a protective material from an unconsolidated state to an at least partially consolidated state over only selected areas of the active surface to form the protective layer.

21. The method of claim 20, further comprising:
storing data including at least one physical parameter of the semiconductor die in computer memory and using the stored data in conjunction with a machine vision system to recognize the location and orientation of at least one feature of the semiconductor device.

22. The method of claim 21, further comprising:
using the stored data, in conjunction with the machine vision system, to selectively form the protective layer over at least one selected region of the active surface in accordance with a program.

23. The method of claim 20, wherein selectively altering is effected in accordance with a program.

24. The method of claim 20, wherein selectively altering comprises directing a controlled, discrete beam of radiation onto the protective material located over the selected portion.

25. The method of claim 20, further comprising:
forming at least one layer of unconsolidated protective material over the surface before selectively altering the state of the protective material.

26. The method of claim 20, further comprising:
removing unconsolidated protective material from the active surface of the semiconductor die or the lead frame following the selectively consolidating.

27. The method of claim 20, further comprising:
further consolidating the at least partially consolidated protective material.

28. A method for forming a protective layer on a selected portion of a surface of a semiconductor device structure, comprising:
recognizing a location and orientation of at least one feature of the semiconductor device structure; and
selectively altering a state of a protective material over at least a portion of the surface from an unconsolidated state to an at least partially consolidated state.

29. The method of claim 28, wherein selectively altering is effected without forming at least partially consolidated protective material over another portion of the surface.

30. The method of claim 28, wherein selectively altering is effected in accordance with a program.

31. The method of claim 30, further comprising:
storing data including at least one physical parameter of the surface of the semiconductor device structure in computer memory and using the stored data in cooperation with a machine vision system to recognize the location and orientation of the at least one feature.

32. The method of claim 31, wherein storing data comprises merging the data for at least one physical parameter for the semiconductor device structure with data for controlling the selectively altering.

33. The method of claim 28, wherein selectively altering comprises directing a controlled, discrete beam of radiation onto the protective material located over at least the portion.

34. The method of claim 28, further comprising forming at least one layer of unconsolidated protective material over the surface before selectively altering the state of the protective material.

35. The method of claim 28, wherein selectively consolidating is effected over a surface of a substrate carrying a plurality of semiconductor devices.

36. The method of claim 28, further comprising:

removing unconsolidated protective material from the surface of the semiconductor device structure following the selectively consolidating.

37. The method of claim 28, further comprising:

further consolidating the at least partially consolidated protective material.

* * * * *